(12) United States Patent
Le et al.

(10) Patent No.: US 6,307,754 B1
(45) Date of Patent: Oct. 23, 2001

(54) CIRCUIT CARD GUIDE

(75) Inventors: Bao Le, Orange; Greg Kabenjian, Duarte, both of CA (US)

(73) Assignee: Gateway, Inc., North Sioux City, SD (US)

(*) Notice: Subject to any disclaimer, the term of this patent is extended or adjusted under 35 U.S.C. 154(b) by 0 days.

(21) Appl. No.: 09/457,967

(22) Filed: Dec. 9, 1999

(51) Int. Cl.$^7$ .................................................. H05K 7/14
(52) U.S. Cl. .................................................. 361/796; 439/377
(58) Field of Search .................................. 361/796, 741, 361/751, 802, 200; 439/64, 377, 637, 631, 632, 633, 636

(56) References Cited

U.S. PATENT DOCUMENTS

| | | | |
|---|---|---|---|
| 5,156,552 | 10/1992 | Zaderej et al. | 439/59 |
| 5,162,979 * | 11/1992 | Anzelone et al. | 361/415 |
| 5,483,422 | 1/1996 | Bowen et al. | 361/802 |
| 5,530,624 | 6/1996 | Noon | 361/802 |
| 5,594,627 * | 1/1997 | Le | 361/801 |
| 5,657,204 | 8/1997 | Hunt | 361/752 |
| 5,680,296 | 10/1997 | Hileman et al. | 361/802 |
| 5,761,030 | 6/1998 | Roscoe | 361/684 |
| 5,761,447 | 6/1998 | Knox et al. | 395/281 |
| 5,822,196 * | 10/1998 | Hastings et al. | 361/801 |
| 5,860,828 | 1/1999 | Anderson et al. | 439/377 |
| 5,889,656 * | 3/1999 | Yin | 361/801 |
| 5,980,299 * | 11/1999 | Davis | 439/377 |
| 6,030,230 * | 2/2000 | Peacock | 439/61 |
| 6,030,251 * | 2/2000 | Stark et al. | 439/377 |
| 6,056,583 * | 5/2000 | Lee et al. | 439/377 |
| 6,088,237 * | 7/2000 | Farnworth et al. | 361/796 |
| 6,089,899 * | 7/2000 | Wang et al. | 439/377 |
| 6,089,900 * | 7/2000 | Ma | 439/377 |
| 6,111,747 * | 8/2000 | Jeffries | 361/684 |
| 6,122,176 * | 9/2000 | Clements | 361/752 |
| 6,129,562 * | 11/2000 | Hong | 439/79 |

\* cited by examiner

Primary Examiner—Tulsidas Patel

(57) ABSTRACT

A circuit card guide comprising a base defining at least one base slot for placement in alignment over a corresponding expansion slot on a computer system motherboard, incorporates one or more insert guides positioned in cooperation with the base slot such that when a user attempts to insert a circuit card by feel, due to partial or complete visual obstruction of the expansion slot by other computer system components, a connector edge of the circuit card can be received by the circuit card guide within a greater range of tolerance than the width of the expansion slot alone, and the connector edge can be guided by the one or more insert guides through the base slot and into the desired expansion slot.

11 Claims, 2 Drawing Sheets

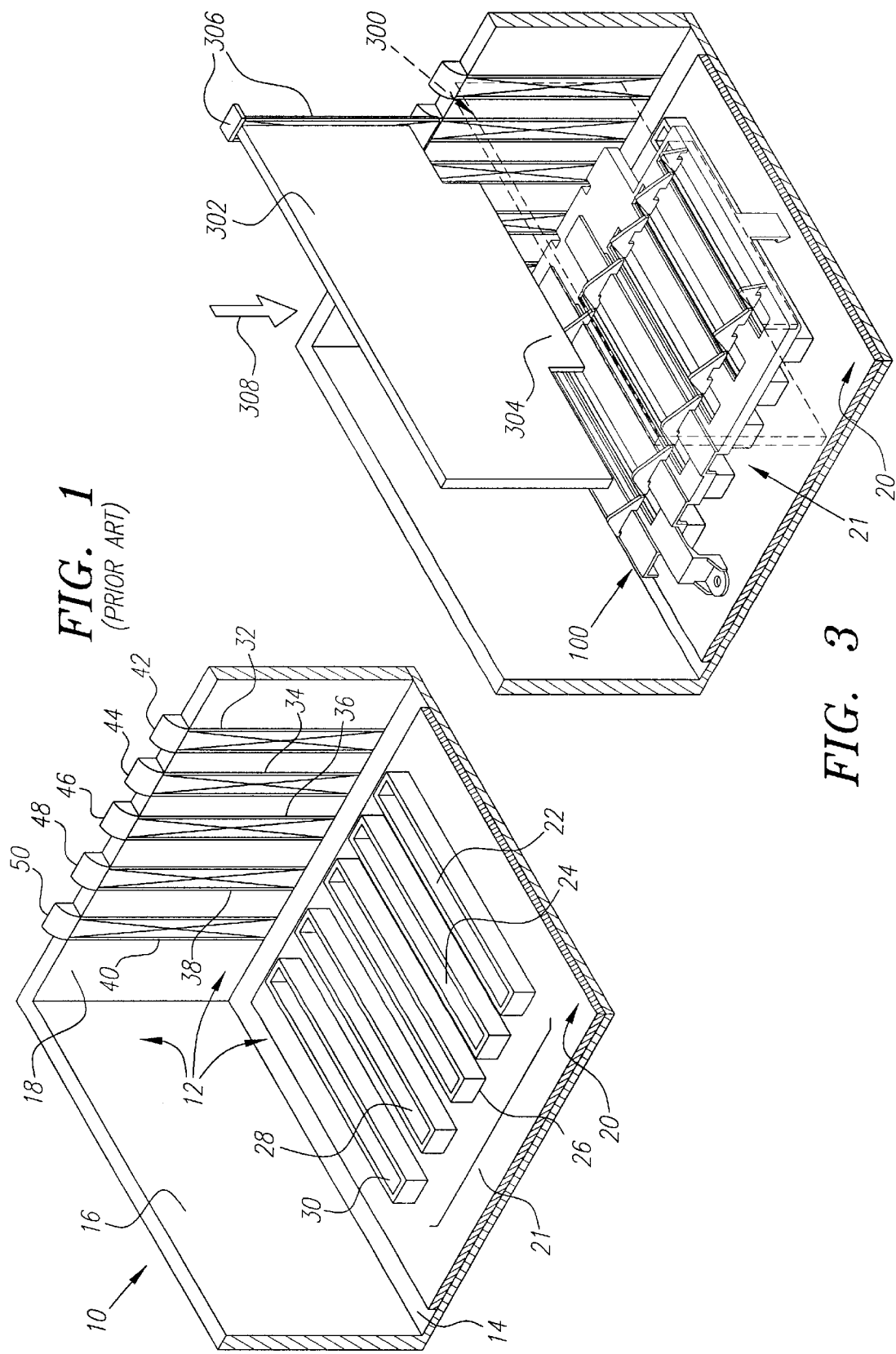

CIRCUIT CARD GUIDE

FIELD OF THE INVENTION

This invention relates to circuit cards for electronic equipment, and more specifically to a circuit card guide for information handling systems such as computers.

BACKGROUND OF THE INVENTION

The installation of a circuit card (also commonly referred to as a PC card, add-in card, expansion card, or I/O card) is a convenient way of adding additional features or functionality to an information handling system, such as a computer. Examples of various types of circuit cards available for installation in computers include fax/modem cards, video cards, graphics accelerator cards, sound cards, and network interface cards, to name a few.

Many of today's computer systems are pre-configured with one or more circuit cards preinstalled by the manufacturer. However, a typical home or business user will eventually add one or more additional circuit cards in order to add or upgrade certain features. Although the procedure for installing or removing circuit cards is well known in the art, and thus, will not be discussed in detail herein, there are times when installing a circuit card is not so simple and straightforward.

For example, when a user opens up a computer chassis to install a new circuit card, there are times when the only available expansion slot for receiving an additional circuit card is the expansion slot that is positioned "behind" an already installed circuit card, i.e., positioned more internally in the chassis than the existing circuit card. This provides the user with two options: (1) the user can either remove the forward-positioned, or more externally located, circuit card, so that the user can more easily access the presently available rearward-positioned, or more internally located, expansion slot; or (2) the user can attempt to "blindly" guide the circuit card into the rearward-positioned expansion slot, since the existing forward-positioned circuit card is obstructing the user's ability to visually place the circuit card's connector edge into the appropriate expansion slot. The drawback to option (1) is that it creates an inconvenience for the user, since the user will have to remove and re-install the obstructing circuit card. The drawbacks to option (2) are that there is potential for damage to the circuit card or the motherboard as the user attempts to insert the circuit card into the appropriate expansion slot "by feel", or there is the possibility of inserting the circuit card into an incorrect expansion slot (when more than one slot is available).

Thus, there is a need for providing a user with a means for simplifying the installation of a circuit card into an information handling system, especially when the receiving expansion slot is positioned behind a previously installed circuit card.

SUMMARY OF THE INVENTION

The circuit card guide of the present invention simplifies the installation of a circuit card into an information handling system by providing a unique system of one or more insert guides, thereby enabling a user to successfully insert a circuit card by feel, since a greater range of tolerance is provided for receiving the circuit card's connector edge into an appropriate expansion slot. In a preferred embodiment of the present invention, a base defining a slot corresponding to an expansion slot is placed over an expansion slot region of a motherboard located within a computer chassis. One or more guides are placed upon an upper surface of the base in a manner such that the connector edge of a circuit card will be guided into the slot on the base, and then through the base and into the appropriate expansion slot on the motherboard.

Accordingly, it is an object of the present invention to provide an article of manufacture comprising a base having a slot corresponding to an expansion slot on a motherboard, wherein one or more insert guides positioned on an upper surface of the base act as a guide, or feeder, or funnel, for receiving and guiding a connector edge of a circuit card within a greater range of tolerance than the receiving expansion slot alone.

It is a further object of the present invention to provide a circuit card guide that can be placed on various expansion slot regions of various motherboard configurations for assisting in the installation of a circuit card, when visual insertion is hindered by a pre-existing circuit card installed in a forward-positioned slot.

Further objects and advantages of the present invention will become apparent from a consideration of the drawings and ensuing description.

BRIEF DESCRIPTION OF THE DRAWINGS

FIG. 1 is a perspective view of a typical configuration within a computer system comprising a motherboard having a plurality of expansion slots for receiving circuit cards.

FIG. 3 is a perspective view of a typical configuration within a computer system further comprising a circuit card guide of the present invention, wherein a previously installed forward-positioned positioned circuit card is shown in phantom, and a second circuit card is shown in the process of being installed.

DETAILED DESCRIPTION OF A PREFERRED EMBODIMENT

Figure 2A:
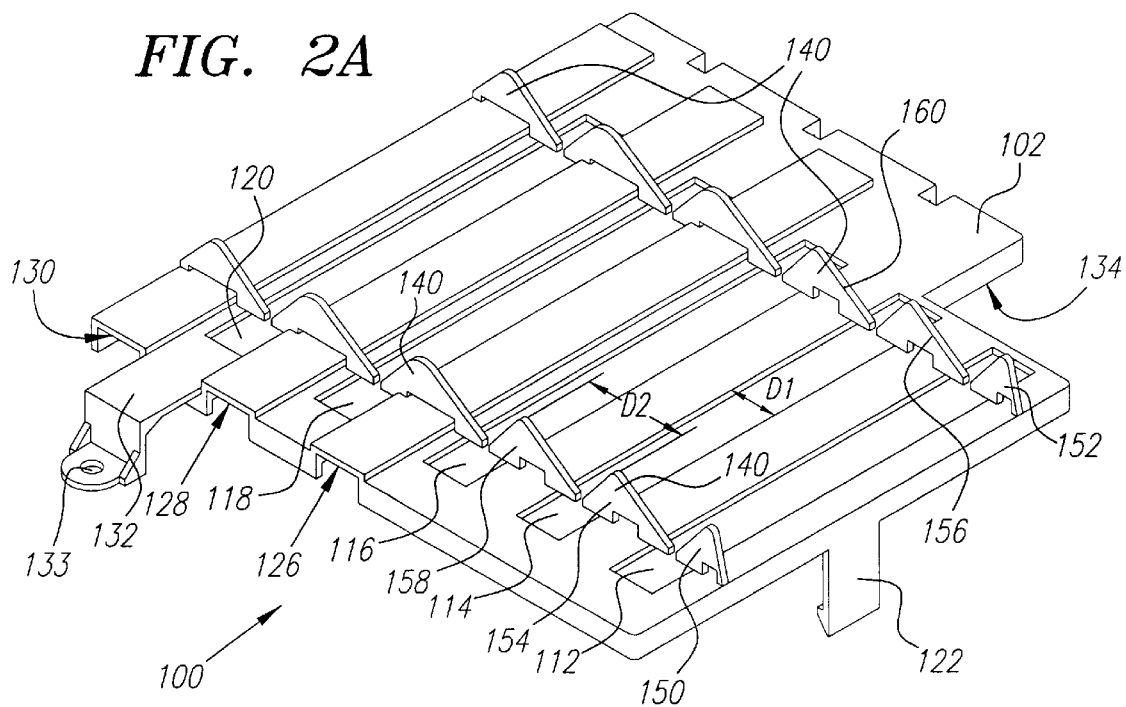
FIGS. 2A and 2B are perspective views of the circuit card guide of the present invention.

FIG. 1 provides a perspective view of a typical configuration within a computer system 10. In such a typical configuration, the computer system 10 comprises a computer chassis 12 having a bottom wall 14, a first side wall 16, a back wall 18, a second side wall (not shown), a front wall (not shown) and a cover (not shown). A motherboard 20 is attached to the bottom wall 14. On the motherboard 20 is an expansion slot region 21 comprising a first expansion slot 22, a second expansion slot 24, a third expansion slot 26, a fourth expansion slot 28, and a fifth expansion slot 30. The back wall 18 correspondingly comprises a first I/O (input/output) slot 32 and a first bracket retainer 42, a second I/O slot 34 and a second bracket retainer 44, a third I/O slot 36 and a third bracket retainer 46, a fourth I/O slot 38 and a fourth bracket retainer 48, and a fifth I/O slot 40 and a fifth bracket retainer 50.

Figure 2B:
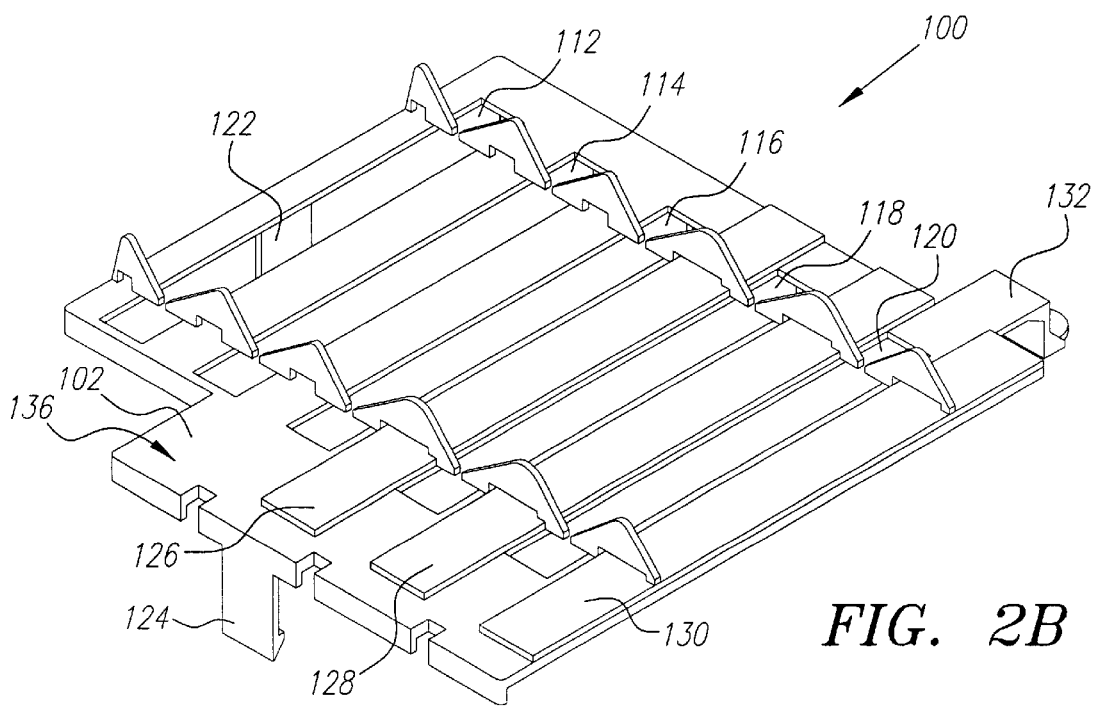

FIGS. 2A and 2B provide a frontal and rearward perspective view, respectively, of a circuit card guide 100 of the present invention. The circuit card guide 100 comprises a base 102 having a lower surface 134 and an upper surface 136. The base 102 has apertures formed therein that correspondingly define a first base slot 112, a second base slot 114, a third base slot 116, a fourth base slot 118, and a fifth base slot 120. The circuit card guide 100 also comprises a first attachment arm 122 and a second attachment arm 124 for securing the circuit card guide 100 over the expansion slot region 21 by either attaching to the motherboard 20 or some other element in the computer system 10 (as shown in
}

FIG. 1). When properly attached and secured, the circuit card guide 100 is aligned with the expansion slot region 21 such that the first through fifth base slots, 112–120, are correspondingly aligned with the first through fifth expansion slots, 22–30. In a preferred embodiment, the base 102 comprises a first riser 126, a second riser 128, and a third riser 130. It is understood that the number of slots may be increased or decreased, and the present invention is not limited to the number of slots as illustrated in the preferred embodiments herein.

Due to the variations in design of various expansion slot regions of various computer systems, there are certain configurations that provide slots, such as ISA slots, that may rise above the height of a typical expansion slot, or that may in some other manner impede the flush mounting of the circuit card guide 100. Thus, in order to get the circuit card guide 100 to sit flush on the expansion slots, 22–30, it may be necessary to provide additional clearance on the lower surface 134 of the base 102 in the regions of the first through third risers, 126–130. Thus, by incorporating these risers, 126–130, the circuit card guide 100 of FIGS. 2A and 2B may be incorporated into more that one typical configuration of a computer system, thereby increasing its applicability, and mitigating the need for a circuit card guide manufacturer to build a unique circuit card guide for every individual computer system configuration.

In addition, the circuit card guide 100 further comprises a third attachment arm 132 that enables a manufacturer to more securely attach the circuit card guide 100 via a screw (not shown) through a screw hole 133 defined by the third attachment arm 132. Other means of attachment could be used, such as adhesives, alternative mechanical locks, bolts, etc.

Provided on the upper surface 136 of the base 102 of the circuit card guide 100 are a plurality of insert guides 140. In a preferred embodiment, the plurality of insert guides 140 are shaped as triangular ramps that are vertically positioned adjacent the base slots such that the triangular ramps present a vertically slanting surface area capable of receiving initial contact with a circuit card (as shown in FIG. 3) and guiding the circuit card into a corresponding base slot. In describing the proper usage of the circuit card guide 100, the following insert guides 140 will be discussed specifically: a first insert guide 150, a second insert guide 152, a third insert guide 154, a fourth insert guide 156, a fifth insert guide 158, and a sixth insert guide 160. The first base slot 112 is surrounded by the first through fourth insert guides, 150–156, and the second base slot 114 is surround by the third through sixth insert guides 154–160. A discussion of the functions of these insert guides 140, as shown in FIGS. 2A and 2B, shall be discussed in conjunction with a discussion of FIG. 3.

Accordingly, the reader's attention is drawn to FIG. 3 (with reference back to FIGS. 1, 2A and 2B for element details), which is the perspective view from FIG. 1 of a typical configuration within a computer system, further comprising the placement of the circuit card guide 100 of the present invention over the expansion slot region 21 of the motherboard 20, wherein the base slots 112–120 are properly aligned over the expansion slots 22–30. A previously installed forward-positioned first circuit card 300 is shown in phantom in the first base slot 112. The term "forward-positioned" is used to describe a position located closer to the first expansion slot 22 within the computer chassis 12, and the term "rearward-positioned" is used to describe a position located closer to the fifth expansion slot 30 within the computer chassis 12. In this illustration, it is assumed that, due to the presence of the first side wall 16, access to rearward-positioned expansion slots is made more difficult due to the visual obstruction created by the more easily accessible first circuit card 300 located in the forward-positioned expansion slot, and/or any other computer system component.

Also shown in FIG. 3 is a second circuit card 302 comprising a connector edge 304 and an attachment bracket 306. An arrow 308 in FIG. 3 illustrates the direction in which a circuit card is typically installed into an expansion slot. A typical circuit card is installed by inserting a connector edge into a corresponding expansion slot, and by placing the circuit card's attachment bracket into proper communication with a corresponding I/O slot on a chassis. However, FIG. 3 illustrates the obstacle presented to a user attempting to install the second circuit card 302 into the second expansion slot 24, due to the partial or complete visual obstruction of the second expansion slot 24 created by the previously installed first circuit card 300 (shown in phantom). Thus, in the past, the user would either have to remove the first circuit card 300, or attempt to insert the second circuit card 302 by feel, i.e., the user would have to attempt to push down the second circuit card 302 in the general vicinity of the second expansion slot 24 in hopes of properly aligning and inserting the connector edge 304 of the second circuit card 302 into the second expansion slot 24; and if the alignment was off, the user would have to lift, realign and re-attempt a proper insertion. This had the potential to damage the motherboard 20 and/or the connector edge 304. Furthermore, it was possible that the second circuit card 302 could be accidentally inserted into the third expansion slot 26, because the desired second expansion slot 24 was missed and not properly located by feel.

Accordingly, in a preferred embodiment, the circuit card guide 100 of the present invention provides a plurality of insert guides 140 to assist a user when the user is attempting to insert a circuit card by feel. As stated previously, the second base slot 114 is surrounded by the third through sixth insert guides 154–160. If a user attempts to insert the connector edge 304 of the second circuit card 302 into the second base slot 114 by feel without the presence of the insert guides 140, the user has a range of tolerance that is measured as the width of the second base slot 114, indicated by the distance D1 (as shown in FIG. 2A). However, due to a preferred "ramp-shaped" embodiment of the insert guides 140, if a user attempts to insert the connector edge 304 of the second circuit card 302 into the second base slot 114 by feel, when the second base slot 114 is surrounded by the third through sixth insert guides 154–160, then the user now has a range of tolerance that is measured as the width of the distance between the peaks of the third and fifth insert guides, 154 and 158 respectively, indicated by the distance D2 (as shown in FIG. 2A); or likewise, between the peaks of the fourth and sixth insert guides, 156 and 160 respectively. This is because an errant attempt to downwardly insert the connector edge 304 into a region within D2, but outside D1, will result in the connector edge 304 making contact with one or more of the insert guides 140 in such a way that the connector edge 304 will be fed down, or slid down, the one or more ramp-shaped insert guides 140 into the second base slot 114. It is understood that the present invention functions best when D2 is greater than D1.

Once the second circuit card 302 is inserted into the second expansion slot 24 via the second base slot 114, the attachment bracket 306 is secured to the computer chassis 12 via the second bracket retainer 44. Various procedures for securing a circuit card to a computer chassis via a bracket retainer, or via screws, are well known in the art. One preferred embodiment is disclosed in U.S. Pat. No. 5,822,196, issued to Hastings et al. on Oct. 13, 1998, which is incorporated herein by reference in its entirety.

While the above description contains many specificities, these should not be construed as limitations on the scope of the invention, but rather as an exemplification of preferred embodiments thereof Many other variations are possible. For example, it is understood that the number, shape and location of the insert guides may vary, while still providing the function of assisting a user in installing a circuit card by feel. In alternative embodiments, a single insert guide could be placed on only one side of a base slot. In another alternative embodiment, each insert guide may be designed to feed a connector edge into only one specific base slot, as compared to some of the presently preferred insert guides, such as the third insert guide 154, which is capable of feeding a connector edge into one of two base slots, depending upon which side of the insert guide's peak that the connector edge first contacts.

Furthermore, it is understood that the circuit card guide of the present invention can be utilized in various information handling systems, and has been shown in a preferred embodiment within a computer system for illustrative purposes only.

What is claimed is:

1. A circuit card guide comprising:
    a base having an upper surface and a lower surface,
        said base defining a base slot having dimensions corresponding to an expansion slot for receiving a connector edge of a circuit card,
        said base being capable of secured placement in alignment with the expansion slot such that the expansion slot is accessible to the circuit card connector edge via said base slot;
    an insert guide positioned on said upper surface of said base in cooperation with said base slot such that said insert guide is capable of directing the connector edge into the expansion slot via said base slot through contact with said insert guide during insertion; and
    at least one attachment arm comprising a protrusion for mechanically hooking onto a corresponding element in communication with the expansion slot, wherein said circuit card guide is securely placed in alignment with the expansion slot via said at least one attachment arm.

2. A circuit card guide comprising:
    a base having an upper surface and a lower surface,
        said base defining a base slot having dimensions corresponding to an expansion slot for receiving a connector edge of a circuit card,
        said base being capable of secured placement in alignment with the expansion slot such that the expansion slot is accessible to the circuit card connector edge via said base slot, and
        said base further comprising a riser, said riser providing additional clearance on said lower surface of said base, thereby allowing said circuit card guide to be used in an alternative configuration where protrusions from a motherboard would otherwise prevent said base from sitting flush with an upper surface of the expansion slot; and
    an insert guide positioned on said upper surface of said base in cooperation with said base slot such that said insert guide is capable of directing the connector edge into the expansion slot via said base slot through contact with said insert guide during insertion.

3. A circuit card guide comprising:
    a base having an upper surface and a lower surface,
        said base defining a base slot having dimensions corresponding to an expansion slot for receiving a connector edge of a circuit card,
        said base being capable of secured placement in alignment with the expansion slot such that the expansion slot is accessible to the circuit card connector edge via said base slot; and
    an insert guide positioned on said upper surface of said base in cooperation with said base slot such that said insert guide is capable of directing the connector edge into the expansion slot via said base slot through contact with said insert guide during insertion, wherein said insert guide is substantially triangular shaped in order to provide a ramp-like insert guide capable of guiding the connector edge down said insert guide toward said corresponding base slot.

4. The circuit card guide of claim 3, wherein said insert guide is positioned in cooperation with said base slot by ensuring that a base of said ramp-like insert guide ends at said base slot, thereby ensuring that once the connector edge has slid down to the base of said ramp-like guide, the connector edge will proceed into said base slot and subsequently into the expansion slot.

5. A circuit card guide comprising:
    a base having an upper surface and a lower surface,
        said base defining a base slot having dimensions corresponding to an expansion slot for receiving a connector edge of a circuit card,
        said base being capable of secured placement in alignment with the expansion slot such that the expansion slot is accessible to the circuit card connector edge via said base slot; and
    an insert guide positioned on said upper surface of said base in cooperation with said base slot such that said insert guide is capable of directing the connector edge into the expansion slot via said base slot through contact with said insert guide during insertion, wherein said base defines a second base slot, and said insert guide being designed in a substantially triangular shape in order to provide a first ramp-like edge and a second ramp-like edge, said first ramp-like edge being capable of guiding the connector edge down said insert guide toward said base slot, and said second ramp-like edge being capable of guiding the connector edge down said insert guide toward said second base slot.

6. An information handling system comprising:
    a chassis having at least a bottom wall, a first side wall and a back wall;
    a motherboard attached to said chassis, having an expansion slot region comprising an expansion slot;
    a circuit card guide secured to said expansion slot region, said circuit card guide comprising a base having an upper surface and a lower surface and further comprising an insert guide and at least one attachment arm,
        said base defining a base slot having dimensions corresponding to the expansion slot for receiving a connector edge of a circuit card,
        said base being in alignment with the expansion slot region such that the expansion slot is accessible to the circuit card connector edge via said base slot;
        said insert guide being positioned on said upper surface of said base in cooperation with said base slot such that said insert guide is capable of directing the connector edge into the expansion slot via said base slot through contact with said insert guide during insertion; and said at least one attachment arm comprising a protrusion for mechanically hooking onto a corresponding element in communication with the expansion slot, wherein said circuit card guide is securely placed in alignment with the expansion slot via said at least one attachment arm.

7. An information handling system comprising:

a chassis having at least a bottom wall, a first side wall and a back wall;

a motherboard attached to said chassis, having an expansion slot region comprising an expansion slot;

a circuit card guide secured to said expansion slot region, said circuit card guide comprising a base having an upper surface and a lower surface and further comprising an insert guide and at least one attachment arm, said base defining a base slot having dimensions corresponding to the expansion slot for receiving a connector edge of a circuit card, said base being in alignment with the expansion slot region such that the expansion slot is accessible to the circuit card connector edge via said base slot;

said insert guide being positioned on said upper surface of said base in cooperation with said base slot such that said insert guide is capable of directing the connector edge into the expansion slot via said base slot through contact with said insert guide during insertion; and said at least one attachment arm comprising an extension defining an opening for receiving a screw, wherein said circuit card guide is securely placed in alignment with the expansion slot via said at least one attachment arm.

8. An information handling system comprising:

a chassis having at least a bottom wall, a first side wall and a back wall;

a motherboard attached to said chassis, having an expansion slot region comprising an expansion slot;

a circuit card guide secured to said expansion slot region, said circuit card guide comprising a base having an upper surface and a lower surface and further comprising an insert guide, said base defining a base slot having dimensions corresponding to the expansion slot for receiving a connector edge of a circuit card, said base being in alignment with the expansion slot region such that the expansion slot is accessible to the circuit card connector edge via said base slot, and said base further comprising a riser, said riser providing additional clearance on said lower surface of said base, thereby allowing said circuit card guide to be used in an alternative configuration where protrusions from a motherboard would otherwise prevent said base from sitting flush with an upper surface of the expansion slot; and said insert guide being positioned on said upper surface of said base in cooperation with said base slot such that said insert guide is capable of directing the connector edge into the expansion slot via said base slot through contact with said insert guide during insertion.

9. An information handling system comprising:

a chassis having at least a bottom wall, a first side wall and a back wall;

a motherboard attached to said chassis, having an expansion slot region comprising an expansion slot;

a circuit card guide secured to said expansion slot region, said circuit card guide comprising a base having an upper surface and a lower surface and further comprising an insert guide, said base defining a base slot having dimensions corresponding to the expansion slot for receiving a connector edge of a circuit card, said base being in alignment with the expansion slot region such that the expansion slot is accessible to the circuit card connector edge via said base slot; and said insert guide being positioned on said upper surface of said base in cooperation with said base slot such that said insert guide is capable of directing the connector edge into the expansion slot via said base slot through contact with said insert guide during insertion, wherein said insert guide is substantially triangular shaped in order to provide a ramp-like insert guide capable of guiding the connector edge down said insert guide toward said corresponding base slot.

10. The information handling system of claim 9, wherein said insert guide is positioned in cooperation with said base slot by ensuring that a base of said ramp-like insert guide ends at said base slot, thereby ensuring that once the connector edge has slid down to the base of said ramp-like guide, the connector edge will proceed into said base slot and subsequently into the expansion slot.

11. An information handling system comprising:

a chassis having at least a bottom wall, a first side wall and a back wall;

a motherboard attached to said chassis, having an expansion slot region comprising an expansion slot;

a circuit card guide secured to said expansion slot region, said circuit card guide comprising a base having an upper surface and a lower surface and further comprising an insert guide, said base defining a base slot having dimensions corresponding to the expansion slot for receiving a connector edge of a circuit card, said base being in alignment with the expansion slot region such that the expansion slot is accessible to the circuit card connector edge via said base slot; and said insert guide being positioned on said upper surface of said base in cooperation with said base slot such that said insert guide is capable of directing the connector edge into the expansion slot via said base slot through contact with said insert guide during insertion, wherein said base defines a second base slot, and said insert guide being designed in a substantially triangular shape in order to provide a first ramp-like edge and a second ramp-like edge, said first ramp-like edge being capable of guiding the connector edge down said insert guide toward said base slot, and said second ramp-like edge being capable of guiding the connector edge down said insert guide toward said second base slot.

* * * * *